United States Patent
Chiu et al.

(10) Patent No.: US 11,456,026 B2
(45) Date of Patent: *Sep. 27, 2022

(54) CONTROL DEVICE AND MEMORY SYSTEM FOR DEEP POWER-DOWN MODE

(71) Applicant: Winbond Electronics Corp., Taichung (TW)

(72) Inventors: Liang-Hsiang Chiu, Taichung (TW); Yu-Chieh Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/196,969

(22) Filed: Mar. 9, 2021

(65) Prior Publication Data
US 2021/0295891 A1    Sep. 23, 2021

(30) Foreign Application Priority Data
Mar. 17, 2020 (TW) ................. 109108754

(51) Int. Cl.
| | |
|---|---|
| *G11C 11/4072* | (2006.01) |
| *G11C 29/02* | (2006.01) |
| *G11C 11/4074* | (2006.01) |
| *G11C 11/4099* | (2006.01) |
| *G11C 29/44* | (2006.01) |
| *G11C 11/4076* | (2006.01) |

(52) U.S. Cl.
CPC ...... *G11C 11/4072* (2013.01); *G11C 11/4074* (2013.01); *G11C 11/4076* (2013.01); *G11C 11/4099* (2013.01); *G11C 29/021* (2013.01); *G11C 29/44* (2013.01)

(58) Field of Classification Search
CPC ............ G11C 11/4072; G11C 11/4074; G11C 11/4076; G11C 11/4099; G11C 29/021; G11C 29/44; G11C 7/22; G11C 2207/2227; G11C 5/147; G11C 5/148
See application file for complete search history.

(56) References Cited

U.S. PATENT DOCUMENTS

| | | |
|---|---|---|
| 6,850,453 B2 | 2/2005 | Park |
| 7,230,475 B2 | 6/2007 | Choi et al. |
| 9,037,890 B2 | 5/2015 | De Caro et al. |

FOREIGN PATENT DOCUMENTS

CN    103854705 A  *  6/2014  .............. G06F 11/00

* cited by examiner

*Primary Examiner* — Sultana Begum
(74) *Attorney, Agent, or Firm* — JCIPRNET

(57) ABSTRACT

A control device and a memory system are provided. The control device includes a first peripheral circuit group and a second peripheral circuit group. The first peripheral circuit group and a memory array are driven by a first voltage in a standby mode. The first peripheral circuit group provides a control command when recognizing that a command string is a deep power-down (DPD) execution command string. When receiving the control command, the second peripheral circuit group provides a DPD signal having a first logic value to stop providing the first voltage so that the memory system enters a DPD mode. In the DPD mode, when recognizing that the command string is a DPD exit command string, the second peripheral circuit group provides a DPD signal having a second logic value to provide the first voltage so that the memory system enters standby mode.

12 Claims, 5 Drawing Sheets

Title: CONTROL DEVICE AND MEMORY SYSTEM FOR DEEP POWER-DOWN MODE

CROSS-REFERENCE TO RELATED APPLICATION

This application claims the priority benefit of Taiwan application serial no. 109108754, filed on Mar. 17, 2020. The entirety of the above-mentioned patent application is hereby incorporated by reference herein and made a part of this specification.

TECHNICAL FIELD

The invention relates to a control device and a memory system for controlling a memory array.

BACKGROUND

In general, to make the memory system more power-efficient, the current memory systems are usually added with a deep power-down mode. Power consumption of the deep power-down mode may be realized by turning off power of some components of the control device.

During a miniature process, both reduction of line width in the manufacturing process and increasing number of components of the control device for controlling a memory array will increase a current value of the deep power saving mode. In other words, during the miniature process, power consumption of the deep power saving mode will be greater. Therefore, in the deep power-down mode, as more of the components of the control device are disabled, power consumption of the deep power-down mode will be reduced. However, while considering power consumption of the deep power-down mode, it is still necessary to make sure that the control device in the deep power-down mode can effectively and correctly exit the deep power-down mode to enter the standby mode.

SUMMARY

The invention provides a control device and a memory system, which are capable of further reducing power consumption of a deep power-down mode and effectively and correctly exiting the deep power-down mode.

A control device of the invention is adapted for controlling a memory array. The control device includes a first peripheral circuit group and a second peripheral circuit group. The first peripheral circuit group is coupled to the memory array. The first peripheral circuit group is configured to be driven together with the memory array by a first voltage in a standby model. In this embodiment, the second peripheral circuit group is coupled to the memory array and the first peripheral circuit group. The second peripheral circuit group is configured to be driven by the second voltage. The second peripheral circuit group includes an input/output buffer and an exit command string decoder. The input/output buffer is coupled to the first peripheral circuit group. The input/output buffer receives a command string. The first peripheral circuit group provides a control command when recognizing that the command string is a deep power-down execution command string. The exit command string decoder is coupled to the input/output buffer. The exit command string decoder is configured to provide a deep power-down signal having a first logic value when receiving the control command. The second peripheral circuit group stops providing the first voltage according to the deep power-down signal having the first logic value so that the control device and the memory array enter the deep power-down mode. In addition, in the deep power-down mode, when recognizing that the command string is the deep power-down exit command string, the exit command string decoder is further configured to transition the first logic value of the deep power-down signal to a second logic value. The second peripheral circuit group provides the first voltage according to the deep power-down signal having the second logic value so that the control device and the memory array enter the standby mode.

The memory system of the invention includes a memory system and the control device described above. The control device is configured to control the memory array.

Based on the above, in the standby mode, the first peripheral circuit group provides the control command when recognizing that the command sequence is the deep power-down execution command string. The exit command string decoder of the second peripheral circuit group provides the deep power-down signal having the first logic value according to the control command so that the memory system enters the deep power-down mode. Further, in the deep power-down mode, when recognizing that the command string is the deep power-down exit command string, the exit command string decoder transitions the first logic value of the deep power-down signal to the second logic value so that the memory system enters the standby mode. In the deep power-down mode, the first peripheral circuit group and the memory array cannot operate because they cannot receive the first voltage. Accordingly, the invention may further reduce power consumption of the deep power-down mode. In addition, the exit command string decoder is disposed in the second peripheral circuit group. The invention can effectively and correctly exit the deep power-down mode.

To make the aforementioned more comprehensible, several embodiments accompanied with drawings are described in detail as follows.

DETAILED DESCRIPTION

Figure 1:
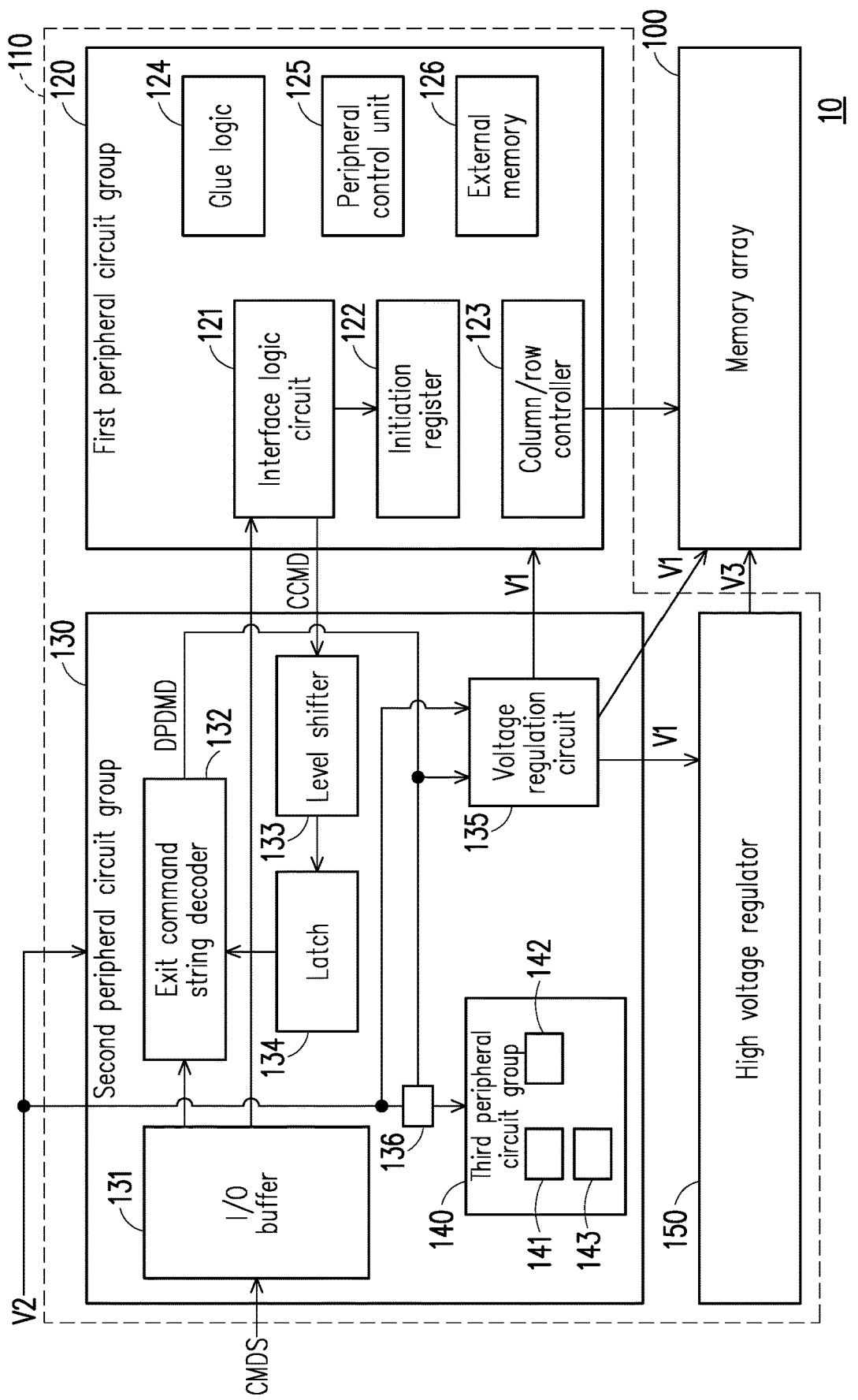
FIG. 1 is a schematic diagram illustrating a memory system illustrated according to an embodiment of the invention.

Referring to FIG. 1, FIG. 1 is a schematic diagram illustrating a memory system illustrated according to an embodiment of the invention. In this embodiment, the memory system 10 includes a memory array 100 and a control device 110 for controlling the memory array 100. In a standby mode, the memory array 100 is driven by a first voltage V1. The control device 110 includes a first peripheral circuit group 120 and a second peripheral circuit group 130.

The first peripheral circuit group 120 is coupled to the memory array 100. In the standby mode, the first peripheral circuit group 120 is driven by the first voltage V1. In other words, the first peripheral circuit group 120 and the memory array 100 are driven together by the first voltage V1 in the standby mode. The first peripheral circuit group 120 may be regarded as a VCC domain power block. The second peripheral circuit group 130 may be regarded as a VDD power domain block.

In this embodiment, the second peripheral circuit group 130 is coupled to the memory array 100 and the first peripheral circuit group 120. The second peripheral circuit group 130 is driven by a second voltage V2. In this embodiment, the first peripheral circuit group 120 and the second peripheral circuit group 130 may be respectively planned as different process elements. For instance, the first peripheral circuit group 120 may be implemented by a 0.3 micron manufacturing process, and the second peripheral circuit group 130 may be implemented by a 0.5 micron manufacturing process.

The second peripheral circuit group 130 includes an input/output buffer 131 and an exit command string decoder 132. The input/output buffer 131 is coupled to the first peripheral circuit group 120. The input/output buffer 131 receives a command string CMDS. The command string CMDS has a plurality of bits. The command string CMDS of this embodiment is, for example, a 8-bit command string, but the invention is not limited to the number of bits of the command string CMDS in this embodiment.

When receiving the command string CMDS, the input/output buffer 130 provides the received command string CMDS to the first peripheral circuit group 120 and the exit command string decoder 132. The first peripheral circuit group 120 and the exit command string decoder 132 respectively recognize the command string CMDS. When the first peripheral circuit group 120 recognizes that the command string CMDS is a deep power-down execution command string, the first peripheral circuit group 120 provides a control command CCMD. On the other hand, when the first peripheral circuit group 120 recognizes that the command string CMDS is other command string, the first peripheral circuit group 120 does not provide the control command CCMD at least.

In this embodiment, the exit command string decoder 132 is coupled to the input/output buffer 131. The exit command string decoder 132 provides a deep power-down signal DPDMD having a first logic value when receiving the control command CCMD. The second peripheral circuit group 130 stops providing the first voltage V1 according to the deep power-down signal DPDMD having the first logic value. Accordingly, the control device 110 and the memory array 100 enter a deep power-down mode. In this embodiment, the first logic value is a high logic value.

In this embodiment, the exit command string decoder 132 decodes the command string CMDS so as to recognize whether the command string CMDS is a deep power-down exit command string. In the deep power-down mode, when the exit command string decoder 132 recognizes that the command string CMDS is the deep power-down exit command string, the exit command string decoder 132 transitions the first logic value of the deep power-down signal DPDMD to a second logic value. The second peripheral circuit group 130 provides the first voltage V1 according to the deep power-down signal DPDMD having the second logic value. Accordingly, the control device 110 and the memory array 100 enter the standby mode. On the other hand, when recognizing that the command string CMDS is other command string, the exit command string decoder 132 does not transition the first logic value of the deep power-down signal DPDMD to the second logic value at least. In this embodiment, the second logic value is a low logic value.

Here, it should be noted that, in the standby mode, when the first peripheral circuit group 120 recognizes that the command string CMDS is the deep power-down execution command string, the exit command string decoder 132 provides the deep power-down signal DPDMD having the first logic value according to the control command CCMD and stops providing the first voltage V1. Accordingly, the memory system 10 enters the deep power-down mode. Further, in the deep power-down mode, when recognizing that the command string CMDS is the deep power-down exit command string, the exit command string decoder 132 transitions the first logic value of the deep power-down signal DPDMD to the second logic value. Accordingly, the memory system 10 enters the standby mode. In the deep power-down mode, the first peripheral circuit group 120 and the memory array 100 cannot operate because they cannot receive the first voltage V1. Therefore, the memory system 10 may further reduce power consumption of the deep power-down mode. In addition, the exit command string decoder 132 is disposed in the second peripheral circuit group 130. Therefore, the exit command string decoder 132 will not be disabled in the deep power-down mode. The exit command string decoder 132 recognizes the command string CMDS having multiple bits. In this way, the memory system 10 can effectively and correctly exit the deep power-down mode.

In this embodiment, the second peripheral circuit group 130 further includes a level shifter 133, a latch 134, a voltage regulation circuit 135, a power switch 136 and a third peripheral circuit group 140. The level shifter 133 is coupled to the first peripheral circuit group 120. The level shifter 133 shifts a voltage level of the control command CCMD. The latch 134 is coupled to the level shifter 133 and the exit command string decoder 132. The latch 134 latches the control command CCMD and provides the control command CCMD to the exit control command decoder 132. The exit command string decoder 132 provides the deep power-down signal DPDMD having the first logic value according to the latched control command CCMD. In addition, the level shifter 133 also shifts the first logic value of the deep power-down signal DPDMD. According to the first logic value of the deep power-down signal DPDMD, the latch 134 stores other information such as related information for entering the standby mode from the deep power-down mode.

In this embodiment, the voltage regulation circuit 135 is coupled to the memory array 100, the first peripheral circuit group 120 and the exit command string decoder 132. The voltage regulation circuit 135 regulates the second voltage V2 to the first voltage V1 according to the deep power-down signal DPDMD having the second logic value, and provides the first voltage V1 to the memory array 100 and the first peripheral circuit group 120. The voltage regulation circuit 135 stops providing the first voltage V1 to the memory array 100 and the first peripheral circuit group 120 according to the deep power-down signal DPDMD having the first logic value.

The power switch 136 is coupled to the third peripheral circuit group 140 and the exit command string decoder 132. The power switch 136 provides the second voltage V2 to the third peripheral circuit group 140 according to the deep power-down signal DPDMD having the first logic value and stops providing the second voltage V2 to the third peripheral circuit group 140 according to the deep power-down signal DPDMD having the first logic value. In this embodiment, the power switch 136 may be implemented by using a P-type MOSFET (Metal-Oxide-Semiconductor Field-Effect Transistor) or a transmission gate. Accordingly, the third peripheral circuit group 140 is driven by the second voltage V2 in the standby mode and stops being driven in the deep power-down mode. In other words, in the deep power-down mode, only the input/output buffer 131, the exit command string decoder 132, the level shifter 133 and the latch 134 are maintained in operation.

For instance, the third peripheral circuit group 140 includes circuits suitable and required for entering the standby mode, such as a power-on circuit 141, a bandgap circuit 142 and an analog circuit 143. It should be understood that, in this embodiment, the third peripheral circuit group 140 and the second peripheral circuit group 130 may be planned as the same process elements. For instance, the third peripheral circuit group 140 and the second peripheral circuit group 130 may be implemented by the 0.5 micron manufacturing process.

In this embodiment, the first peripheral circuit group 120 includes an interface logic circuit 121 and an initialization register 122. The interface logic circuit 121 is coupled to the input/output buffer 131. The interface logic circuit 121 receives the command string CMDS through the input/output buffer 131. In the standby mode, the interface logic circuit 121 recognizes the command string CMDS. When recognizing that the command string CMDS is the deep power-down execution command string, the interface logic circuit 121 decodes the deep power-down execution command string to generate the control command CCMD and provides the control command CCMD to the second peripheral circuit group 130. The initialization register 122 is coupled to the interface logic circuit 121. When the first peripheral circuit group 120 receives the first voltage V1, the initialization register 122 is enabled to perform an initialization on the interface logic circuit 121.

In this embodiment, the first peripheral circuit group 120 at least further includes a row/column controller 123, a glue circuit 124, a peripheral control unit 125 and an external memory 126.

The control device 110 further includes a high voltage regulator 150. The high voltage regulator 150 is coupled to the voltage regulation circuit 135. In the standby mode, the high voltage regulator 150 regulates the first voltage V1 provided by the voltage regulation circuit 135 to a third voltage V3 and provides the third voltage V3 to the memory array 100. A voltage value of the third voltage is higher than a voltage value of the second voltage. In the deep power-down mode, the high voltage regulator 150 cannot receive the first voltage V1 provided by the voltage regulation circuit 135. Therefore, the high voltage regulator 150 is disabled and does not provide the third voltage V3 in the deep power-down mode.

Figure 2:
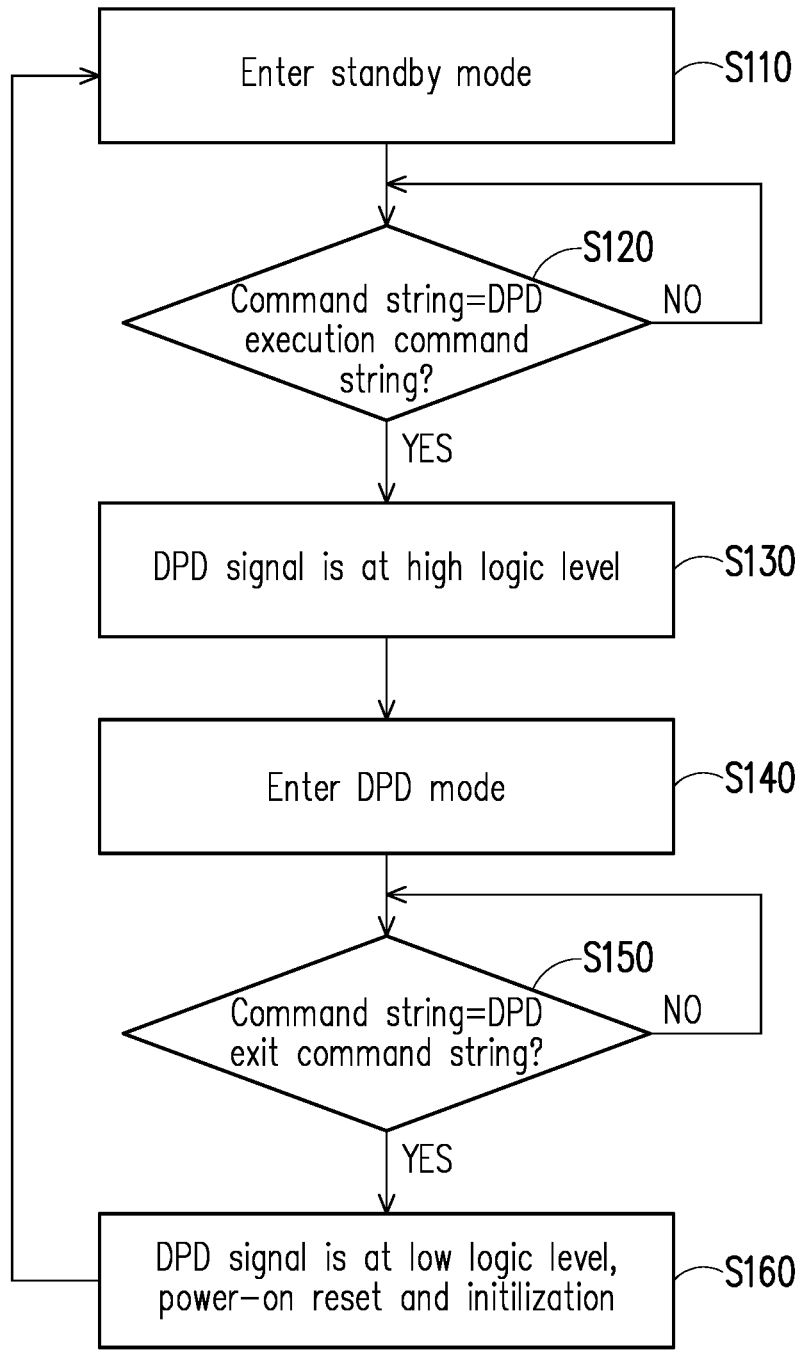
FIG. 2 is a flowchart of a mode conversion process illustrated according to an embodiment of the invention.
Figure 3:
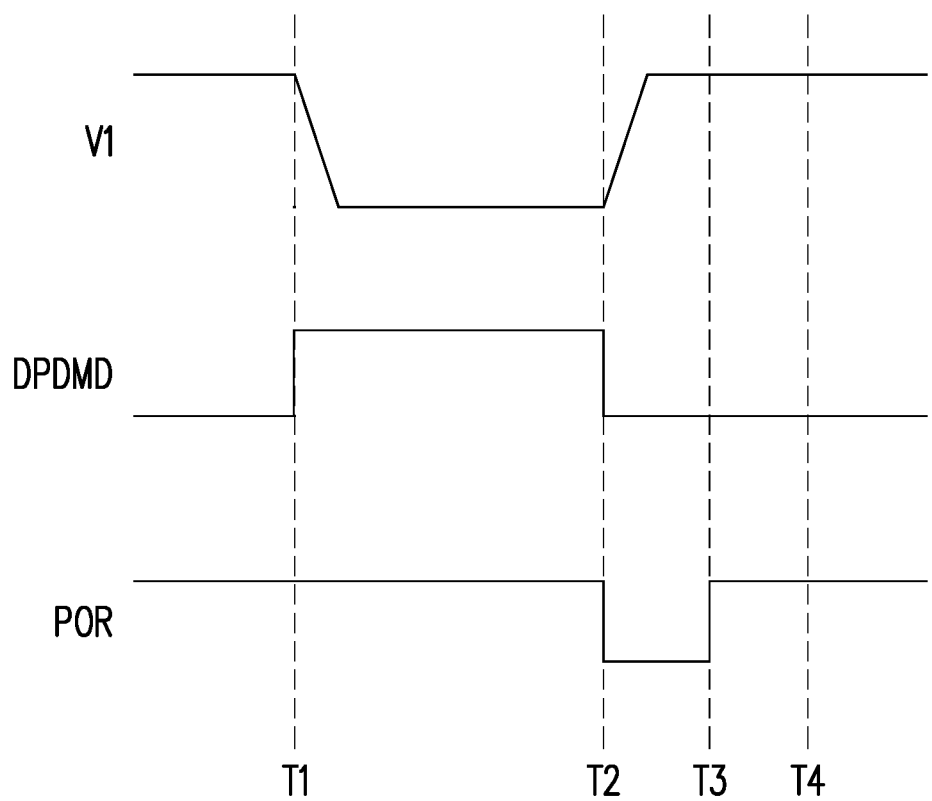
FIG. 3 is a signal timing diagram illustrated according to an embodiment of the invention.

Referring to FIG. 1, FIG. 2 and FIG. 3 together, FIG. 2 is a flowchart of a mode conversion process illustrated according to an embodiment of the invention. FIG. 3 is a signal timing diagram illustrated according to an embodiment of the invention. In this embodiment, the control device 110 and the memory system 100 of the memory system 10 enters the standby mode in step S110. In step S110, the second peripheral circuit group 130 provides the first voltage V1. The deep power-down signal DPDMD is at the second logic value (a low logic level). A power-on reset signal POR is at a high logic level. The power-on reset signal POR at the high logic level means that the control device 110 is performing a power-on procedure.

In step S120, the interface logic circuit 121 recognizes whether the received command string CMDS is the deep power-down execution command string. If the command string CMDS is recognized as the deep power-down execution command string, the interface logic circuit 121 provides the command string CCMD. The level of the control command CCMD is shifted, latched and provided to the exit control command decoder 132. In step S130, the exit command string decoder 132 receives the command string CCMD at a time point T1 an provides the deep power-down signal DPDMD having a first logic level according to the control command CCMD. At the time, the latch 134 latches the related information according to the deep power-down signal DPDMD having the first logic level. In this embodiment, the high logic level of the power-on reset signal POR is latched. In certain embodiments, the logic level of the power-on reset signal POR is transitioned to the low logic level at the time point T1. In step S140, the voltage regulation circuit 135 is disabled according to the deep power-down signal DPDMD having the first logic level to stop providing the first voltage V1. The power switch 136 is turned off according to the deep power-down signal DPDMD having the first logic level to stop transmitting the second voltage V2. Accordingly, the control device 110 and the memory array 100 enter the deep power-down mode. In the deep power-down mode, the memory array 110, the first peripheral circuit group 120, the third peripheral circuit group 140 and the high voltage regulator 150 will stop operating.

Returning to step S120, on the other hand, if the command string CMDS is recognized as not being the deep power-down execution command string, the mode conversion process returns to step S120.

In step S150, in the deep power-down mode, the exit command string decoder 132 recognizes whether the received command string CMDS is the deep power-down exit command string. If the command string CMDS is recognized as the deep power-down exit command string, the mode conversion process enters step S160.

In step S160, the exit command string decoder 132 transitions the first logic level of the deep power-down signal DPDMD to a second logic level at a time point T2. At the time point T2, the voltage regulation circuit 135 is enabled according to the deep power-down signal DPDMD having the second logic level to regulate the second voltage V2 to the first voltage V1 and provides the first voltage V1. The power switch 136 is turned on according to the deep power-down signal DPDMD having the second logic level to transmit the second voltage V2. At the time point T2, the third peripheral circuit group 140 starts operating. The power-on circuit 141 provides the power-on reset signal POR having the low logic level, and provides the power-on reset signal POR having the high logic level at a time point T3. It should be noted that, a power-on delay time length between the time point T3 and the time point T2 is preset, so as to ensure that a voltage value of the first voltage V1 can rise to an expected voltage level.

At the time point T3, the power-on procedure will be started. Next, the initialization register 122 starts the initialization on the interface logic circuit 121 at the time point T3. At a time point T4, the initialization is ended. After the time point T4, the interface logic circuit 121 of the first peripheral circuit group 120 may start to operate normally. The mode conversion process returns to S110 so that the control device 110 enters the standby mode. In other words, after the deep power-down signal DPDMD is transitioned to the second logic value (the time point T2), the control device 110 and the memory array 100 undergo the power-on delay time length between the time point T3 and T2 and an initialization delay time length between the time point T4 and the time point T3 before entering the standby mode.

In this embodiment, the power-on delay time length between the time point T3 and the time point T2 and the initialization delay time length between the time point T4 and the time point T3 may be set by the analog circuit 143. The analog circuit 143 may be implemented by a timer or a counter.

Returning to step S150, on the other hand, if the command string CMDS is recognized as not being the deep power-down exit command string, the mode conversion process returns to step S150.

Figure 4A:
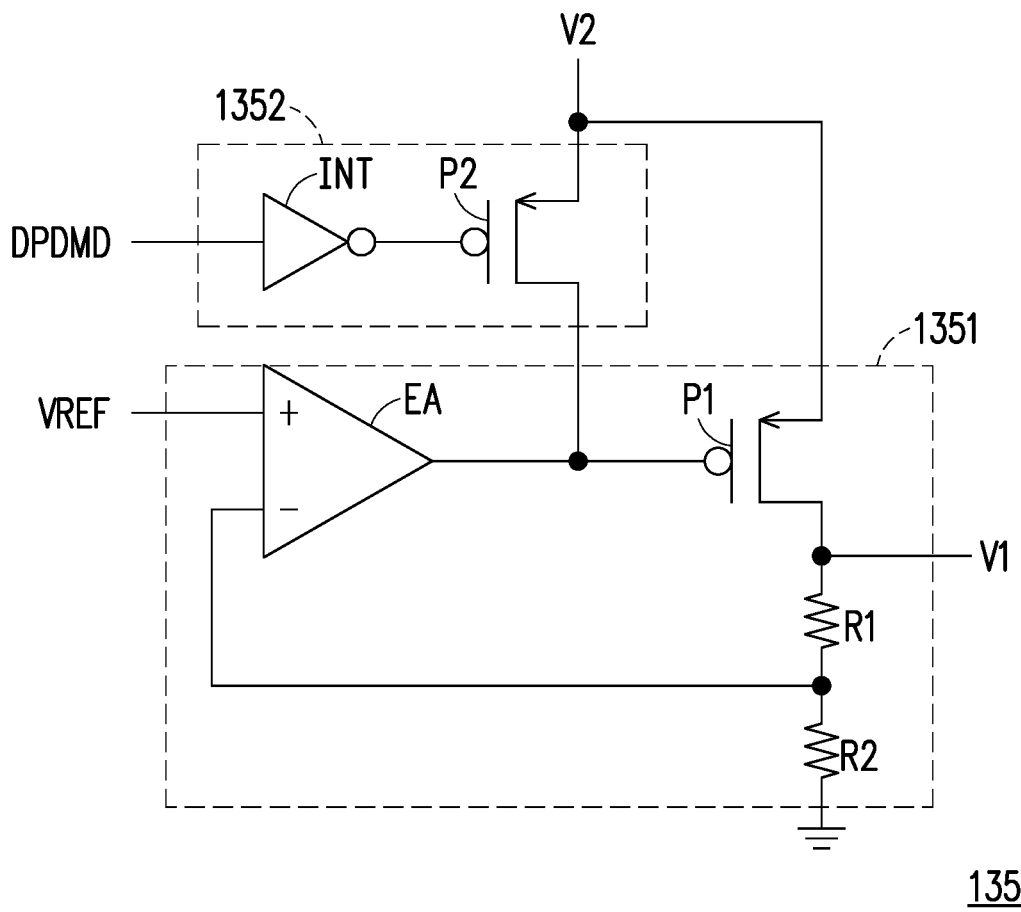
FIG. 4A is a circuit diagram of a voltage regulation circuit illustrated according to an embodiment of the invention.

Detailed implementation of the voltage regulation circuit will be described as follows. Referring to FIG. 4A, FIG. 4A is a circuit diagram of a voltage regulation circuit illustrated according to an embodiment of the invention. In this embodiment, a voltage regulation circuit 135A includes a regulator 1351 and a control switch 1352. The regulator 1351 regulates the second voltage V2 to the first voltage V1 according to a reference voltage VREF. The control switch 1352 is coupled to the regulator 1351. The control switch 1352 enables the regulator 1351 according to the deep power-down signal DPDMD having the second logic level and disables the regulator 1351 according to the deep power-down signal DPDMD having the first logic level.

In this embodiment, the regulator 1351 includes an error amplifier EA, a first transistor P1, a first divider resistor R1 and a second divider resistor R2. A non-inverting input terminal of the error amplifier EA is configured to receive the reference voltage VREF. The reference voltage VREF of the present embodiment may be provided by the bandgap circuit 142, for example. The first transistor P1 of the present embodiment is implemented by a P-type MOSFET, for example. A source of the first transistor P1 is configured to receive the second voltage V2. A gate of the first transistor P1 is coupled to an output terminal of the error amplifier EA. A drain of the first transistor P1 serves as an output terminal of the voltage regulation circuit 135A. The first divider resistor R1 is coupled to the drain of the first transistor P1 and an inverting input terminal of the error amplifier EA. The second divider resistor R2 is coupled between the inverting input terminal of the error amplifier EA and a reference low voltage (e.g., grounded). The regulator 1351 may be implemented by a low-dropout regulator (LDO).

In this embodiment, the control switch 1352 includes an inverter INT and a second transistor P2. An input terminal of the inverter INT is configured to receive the deep power-down signal DPDMD. A source of the second transistor P2 is configured to receive the second voltage V2. A gate of the second transistor P2 is coupled to an output terminal of the inverter INT. A drain of the second transistor P2 is coupled to the output terminal of the error amplifier EA. The second transistor P2 of the present embodiment is implemented by a P-type MOSFET, for example.

The voltage regulation circuit 135A shown in FIG. 4A is applicable to a case where the voltage value of the second voltage V2 is different from the voltage value of the first voltage V1, and also applicable to a case where the voltage value of the second voltage V2 is the same as the voltage value of the first voltage V1. In this example, the voltage value of the second voltage V2 is 3 V. When the control switch 1352 receives the deep power-down signal DPDMD having the low logic level, because the logic level of the deep power-down signal DPDMD is inverted by the inverter INT, the second transistor P2 is turned off. The regulator 1351 is enabled to regulate the voltage value of the first voltage V1. In this example, a voltage value of the reference voltage VREF is 1.2 V. If the voltage value of the first voltage V1 is to be made to 1.8 V, a resistance value of the second divider resistor R2 may be set to twice a resistance value of the first divider resistor R1. It can be known that based on design requirements, the voltage value of the first voltage V1 may be determined according to at least one of the resistance value of the first divider resistor R1, the resistance value of the second divider resistor R2 and the voltage value of the reference voltage VREF. The invention is not limited in this regard.

On the other hand, when the control switch 1352 receives the deep power-down signal DPDMD having the high logic level, the logic level of the deep power-down signal DPDMD is inverted by the inverter INT. The second transistor P2 is turned on. The gate of the second transistor P2 receives the second voltage V2 and is forcibly turned off. The voltage regulation circuit 135A is disabled and stops providing the first voltage V1.

Figure 4B:
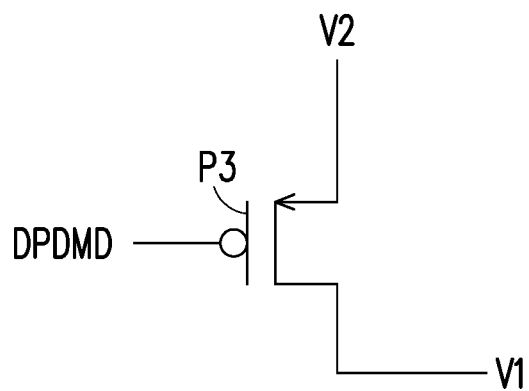
FIG. 4B is a circuit diagram of a voltage regulation circuit illustrated according to another embodiment of the invention.

Referring to FIG. 4B, FIG. 4B is a circuit diagram of a voltage regulation circuit illustrated according to another embodiment of the invention. In this embodiment, a voltage regulation circuit 135B includes a transistor P3. A source of the transistor P3 is configured to receive the second voltage V2. A gate of the transistor P3 is configured to receive the deep power-down signal DPDMD. A drain of the transistor P3 is configured to serve as an output terminal of the voltage regulation circuit 135B.

The voltage regulation circuit 135B shown in FIG. 4B is applicable to a case where the voltage value of the second voltage V2 is the same as the voltage value of the first voltage V1. When the gate of the transistor P3 receives the deep power-down signal DPDMD having the low logic level, the transistor P3 is turned on. Therefore, the transistor P3 may transmit the second voltage V2 to the drain of the transistor P3, so as to use the second voltage V2 as the first voltage V1. On the other hand, when the gate of the transistor P3 receives the deep power-down signal DPDMD having the high logic level, the transistor P3 is turned off. The transistor P3 cannot transmit the second voltage V2 to the drain of the transistor P3. Therefore, the voltage regulation circuit 135B cannot provide the first voltage V1. The transistor P3 of the present embodiment is implemented by a P-type MOSFET, for example.

Figure 5:
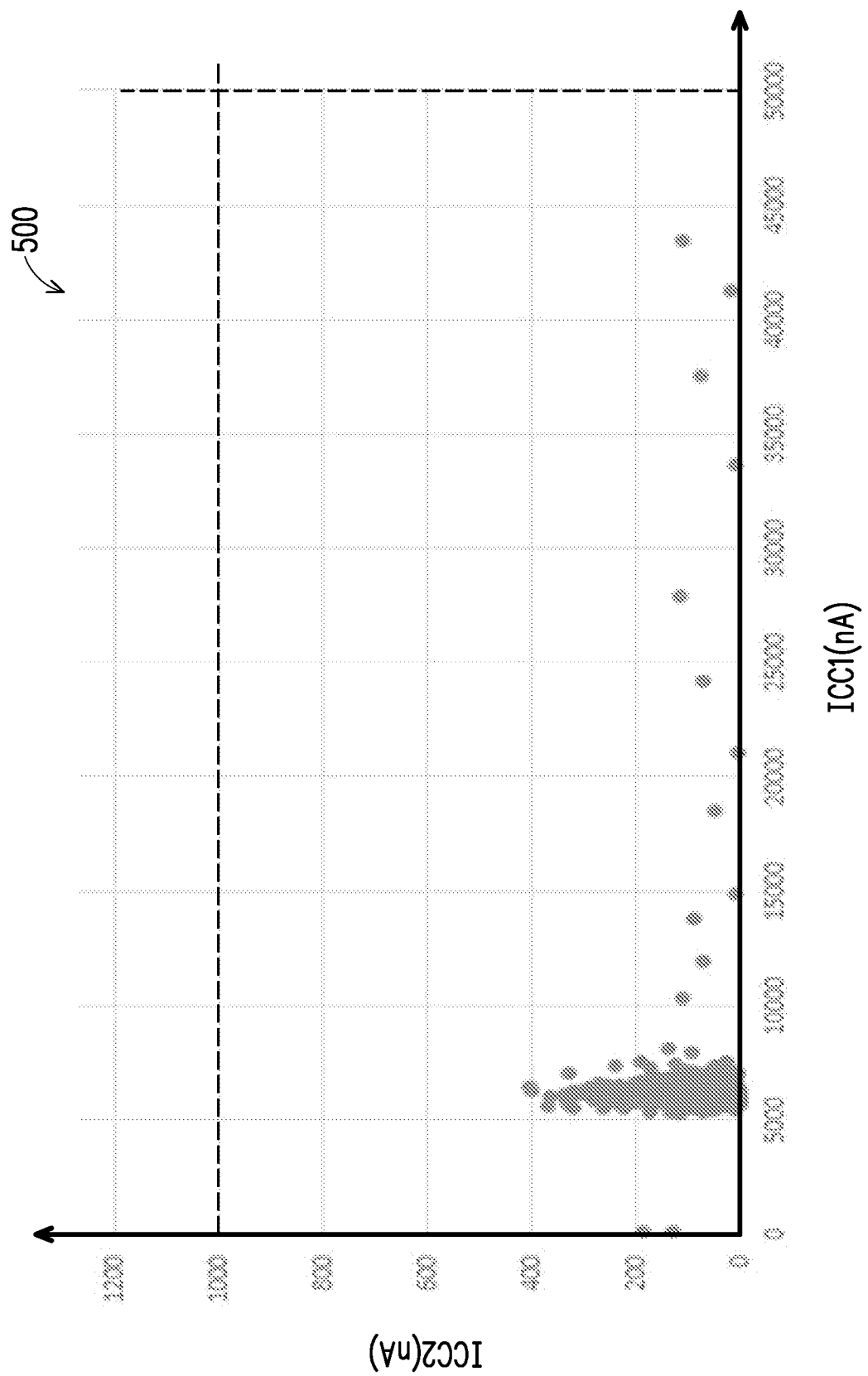
FIG. 5 is a relationship diagram of an operation current value of a deep power-down mode corresponding to an operation current value of a standby mode illustrated according to an embodiment of the invention.

Referring to FIG. 5, FIG. 5 is a relationship diagram of an operation current value of a deep power-down mode corresponding to an operation current value of a standby mode illustrated according to an embodiment of the invention. A relationship diagram 500 shows a relationship between an operation current value ICC2 of the deep power-down mode corresponding to an operation current value ICC1 of the standby mode. The operation current value ICC1 of the standby mode relates to line width in the manufacturing process and the number of the elements in the control device, for example. It should be noted that no matter what the operation current value ICC1 is in the standby mode (0 to 50 microamperes), the operation current value ICC2 in the deep power saving mode can be controlled to be less than 0.405 microamperes. Even if the operation current value ICC1 in the standby mode is in an interval between 10 and 50 microamperes, the operation current value ICC2 in the deep power saving mode may still be controlled to be less than 0.2 microamperes. It can be seen that the operation current value ICC2 in the deep power saving mode is significantly lower than a specification value (1 microampere).

In summary, in the standby mode, the first peripheral circuit group provides the control command when recognizing that the command sequence is the deep power-down execution command string. The exit command string decoder of the second peripheral circuit group provides the deep power-down signal having the first logic value according to the control command so that the memory system enters the deep power-down mode. Further, in the deep power-down mode, when recognizing that the command string is the deep power-down exit command string, the exit command string decoder transitions the first logic value of the deep power-down signal to the second logic value so that the memory system enters the standby mode. In the deep power-down mode, the first peripheral circuit group and the memory array cannot operate because they cannot receive the first voltage. Accordingly, the invention may further reduce power consumption of the deep power-down mode. In addition, the exit command string decoder is disposed in the second peripheral circuit group. The invention can effectively and correctly exit the deep power-down mode.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

The invention claimed is:

1. A control device adapted for controlling a memory array, comprising:
 a first peripheral circuit group, coupled to the memory array, and configured to be driven together with the memory array by a first voltage in a standby mode; and
 a second peripheral circuit group, coupled to the memory array and the first peripheral circuit group, configured to be driven by a second voltage, and comprising:
  an input/output buffer, coupled to the first peripheral circuit group, and configured to receive a command string, wherein the first peripheral circuit group provides a control command when recognizing that the command string is a deep power-down execution command string;
  an exit command string decoder, coupled to the input/output buffer, and configured to:
   provide a deep power-down signal having a first logic value when receiving the control command so that the second peripheral circuit group stops providing the first voltage according to the deep power-down signal having the first logic value and the control device and the memory array enter a deep power-down mode, and
   transition the first logic value of the deep power-down signal to a second logic value when recognizing that the command string is a deep power-down exit command string in the deep power-down mode so that the second peripheral circuit group provides the first voltage according to the deep power-down signal having the second logic value and the control device and the memory array enter the standby mode,
 wherein the first peripheral circuit group and the memory array are driven together by the first voltage in the standby mode, and the first peripheral circuit group and the memory array stop operating in the deep power-down mode.

2. The control device according to claim 1, wherein the second peripheral circuit group further comprises:
 a level shifter, coupled to the first peripheral circuit group, and configured to shift a voltage level of the control command; and
 a latch, coupled to the level shifter and the exit command string decoder, and configured to latch the control command and provide the control command to the exit command string decoder.

3. The control device according to claim 1, wherein the second peripheral circuit group further comprises:
 a voltage regulation circuit, coupled to the memory array, the first peripheral circuit group and the exit command string decoder, and configured to regulate the second voltage to the first voltage according to the deep power-down signal having the second logic value, provide the first voltage to the memory array and the first peripheral circuit group, and stop providing the first voltage according to the deep power-down signal having the first logic value.

4. The control device according to claim 3, wherein the voltage regulation circuit comprises:
 a regulator, configured to regulate the second voltage to the first voltage according to a reference voltage;
 a control switch, coupled to the regulator, and configured to enable the regulator according to a second logic level and disable the regulator according to a first logic level.

5. The control device according to claim 4, wherein the regulator comprises:
 an error amplifier, a non-inverting input terminal of the error amplifier being configured to receive the reference voltage;
 a first transistor, a source of the first transistor being configured to receive the second voltage, a gate of the first transistor being coupled to an output terminal of the error amplifier, wherein a drain of the first transistor serves as an output terminal of the voltage regulation circuit;
 a first divider resistor, coupled between the drain of the first transistor and an inverting input terminal of the error amplifier; and
 a second divider resistor, coupled between the inverting input terminal of the error amplifier and a reference low voltage.

6. The control device according to claim 5, wherein the control switch comprises:
 an inverter, an input terminal of the inverter being configured to receive the deep power-down signal; and
 a second transistor, a source of the second transistor being configured to receive the second voltage, a gate of the second transistor being coupled to an output terminal of the inverter, a drain of the second transistor being coupled to an output terminal of a comparator.

7. The control device according to claim 3, wherein a voltage value of the first voltage is equal to a voltage value of the second voltage, wherein the voltage regulation circuit comprises:
 a transistor, a source of the transistor being configured to receive the second voltage, a gate of the transistor being configured to receive the deep power-down signal, a drain of the transistor being configured to serve as an output terminal of the voltage regulation circuit.

8. The control device according to claim 1, wherein the second peripheral circuit group further comprises:
 a third peripheral circuit group, configured to be driven by the second voltage in the standby mode and stop being driven in the deep power-down mode.

9. The control device according to claim 8, wherein the second peripheral circuit group further comprises:

a power switch, coupled to the third peripheral circuit group and the exit command string decoder, and configured to provide the second voltage to the third peripheral circuit group according to the deep power-down signal having the second logic value and stop providing the second voltage to the third peripheral circuit group according to the deep power-down signal having the first logic value.

10. The control device according to claim 1, wherein the first peripheral circuit group comprises:
an interface logic circuit, coupled to the input/output buffer, and configured to receive the command string through the input/output buffer, decode the deep power-down execution command string to generate the command string when recognizing that the command string is the deep power-down execution command string and provide the control command to the second peripheral circuit group.

11. The control device according to claim 1, wherein after the deep power-down signal is transitioned to the second logic value, the control device undergoes a power-on delay time length and an initialization delay time length before entering the standby mode.

12. A memory system, comprising:
a memory array; and
a control device configured to control the memory array, and comprising:
a first peripheral circuit group, coupled to the memory array, and configured to be driven together with the memory array by a first voltage in a standby mode; and
a second peripheral circuit group, coupled to the memory array and the first peripheral circuit group, configured to be driven by a second voltage, and comprising:
an input/output buffer, coupled to the first peripheral circuit group, and configured to receive a command string, wherein the first peripheral circuit group provides a control command when recognizing that the command string is a deep power-down execution command string;
an exit command string decoder, coupled to the input/output buffer, and configured to:
provide a deep power-down signal having a first logic value when receiving the control command so that the second peripheral circuit group stops providing the first voltage according to the deep power-down signal having the first logic value and the control device and the memory array enter a deep power-down mode, and
transition the first logic value of the deep power-down signal to a second logic value when recognizing that the command string is a deep power-down exit command string in the deep power-down mode so that the second peripheral circuit group provides the first voltage according to the deep power-down signal having the second logic value and the control device and the memory array enter the standby mode,
wherein the first peripheral circuit group and the memory array are driven together by the first voltage in the standby mode, and the first peripheral circuit group and the memory array stop operating in the deep power-down mode,
wherein the first peripheral circuit group comprises:
an interface logic circuit, coupled to the input/output buffer, and configured to receive the command string through the input/output buffer; and
an initialization register, coupled to the interface logic circuit, and configured to perform an initialization on the interface logic circuit.

* * * * *